(12) United States Patent
Tetsuka

(10) Patent No.: US 11,595,134 B2
(45) Date of Patent: Feb. 28, 2023

(54) POWER OVER FIBER SYSTEM

(71) Applicant: KYOCERA CORPORATION, Kyoto (JP)

(72) Inventor: Nobuyuki Tetsuka, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/663,667

(22) Filed: May 17, 2022

(65) Prior Publication Data

US 2022/0278758 A1     Sep. 1, 2022

Related U.S. Application Data

(63) Continuation of application No. 17/442,599, filed as application No. PCT/JP2020/037075 on Sep. 30, 2020, now Pat. No. 11,368,230.

(30) Foreign Application Priority Data

Oct. 21, 2019    (JP) .............................. JP2019-191756

(51) Int. Cl.
*H04B 10/80*     (2013.01)
*H02J 50/30*     (2016.01)
*H01S 5/042*     (2006.01)
*H04B 10/25*     (2013.01)

(52) U.S. Cl.
CPC ......... *H04B 10/807* (2013.01); *H01S 5/0421* (2013.01); *H02J 50/30* (2016.02); *H04B 10/25* (2013.01)

(58) Field of Classification Search
None
See application file for complete search history.

(56) References Cited

U.S. PATENT DOCUMENTS

| | | | | |
|---|---|---|---|---|
| 5,715,075 A * | 2/1998 | Tanaka | ................ | H04B 10/572 398/48 |
| 6,233,262 B1 * | 5/2001 | Mesh | .................... | H01S 5/0687 372/32 |
| 8,358,893 B1 * | 1/2013 | Sanderson | ........... | G02B 6/4415 385/115 |

(Continued)

FOREIGN PATENT DOCUMENTS

| | | |
|---|---|---|
| CN | 102884461 A | 1/2013 |
| CN | 107843901 A | 3/2018 |

(Continued)

*Primary Examiner* — David W Lambert
(74) *Attorney, Agent, or Firm* — Hauptman Ham, LLP

(57) ABSTRACT

A power over fiber system includes a power sourcing equipment, a powered device, an optical fiber cable, a measurer and a control device. The power sourcing equipment includes a semiconductor laser that oscillates with electric power, thereby outputting feed light. The powered device includes a photoelectric conversion element that converts the feed light into electric power. The optical fiber cable transmits the feed light from the power sourcing equipment to the powered device. The measurer measures a distance from the power sourcing equipment to the powered device. The control device controls the power sourcing equipment to output the feed light by changing a laser wavelength thereof for the distance from the power sourcing equipment to the powered device measured by the measurer.

5 Claims, 9 Drawing Sheets

(56) References Cited

U.S. PATENT DOCUMENTS

| | | | | |
|---|---|---|---|---|
| 2001/0021298 A1* | 9/2001 | Mukasa | ............... | G02B 6/0285 |
| | | | | 385/124 |
| 2002/0102085 A1* | 8/2002 | Arai | ................... | G02B 6/02014 |
| | | | | 385/127 |
| 2005/0226625 A1* | 10/2005 | Wake | ............... | H04B 10/25753 |
| | | | | 398/115 |
| 2009/0279890 A1* | 11/2009 | Duan | ................ | H04B 10/2513 |
| | | | | 398/58 |
| 2011/0181436 A1* | 7/2011 | Davey | ................ | E21B 33/0385 |
| | | | | 340/854.7 |
| 2018/0083715 A1* | 3/2018 | Greene | ................ | H04B 10/807 |
| 2018/0375590 A1* | 12/2018 | Skertic | ................ | H04B 10/807 |

FOREIGN PATENT DOCUMENTS

| | | |
|---|---|---|
| CN | 108603758 A | 9/2018 |
| JP | H8331061 A | 12/1996 |
| JP | 2005198396 A | 7/2005 |
| JP | 2010135989 A | 6/2010 |
| JP | WO2011158283 A1 | 8/2013 |

\* cited by examiner

POWER OVER FIBER SYSTEM

The present application is a continuation of U.S. patent application Ser. No. 17/442,599 filed on Sep. 23, 2021, which is a National Stage Entry of PCT/JP2020/037075 filed on Sep. 30, 2020 and claims the benefit of priority from the prior Japanese Patent Application No. 2019-191756, filed on Oct. 21, 2019, the entire contents of which are incorporated herein by reference.

TECHNICAL FIELD

The present disclosure relates to a power over fiber system.

BACKGROUND ART

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, further improvement of optical power supply efficiency is required. As one way therefor, improvement of photoelectric conversion efficiency at the power supplying side and the power receiving side is required.

Solution to Problem

A power over fiber system according to an aspect of the present disclosure includes:
a power sourcing equipment including a semiconductor laser that oscillates with electric power, thereby outputting feed light;
a powered device including a photoelectric conversion element that converts the feed light into electric power;
an optical fiber cable that transmits the feed light from the power sourcing equipment to the powered device;
a measurer that measures a distance from the power sourcing equipment to the powered device; and
a control device that controls the power sourcing equipment to output the feed light by changing a laser wavelength thereof for the distance from the power sourcing equipment to the powered device measured by the measurer.

DESCRIPTION OF EMBODIMENTS

Hereinafter, embodiments of the present disclosure will be described with reference to the drawings.

(1) Outline of System

First Embodiment

Figure 1:
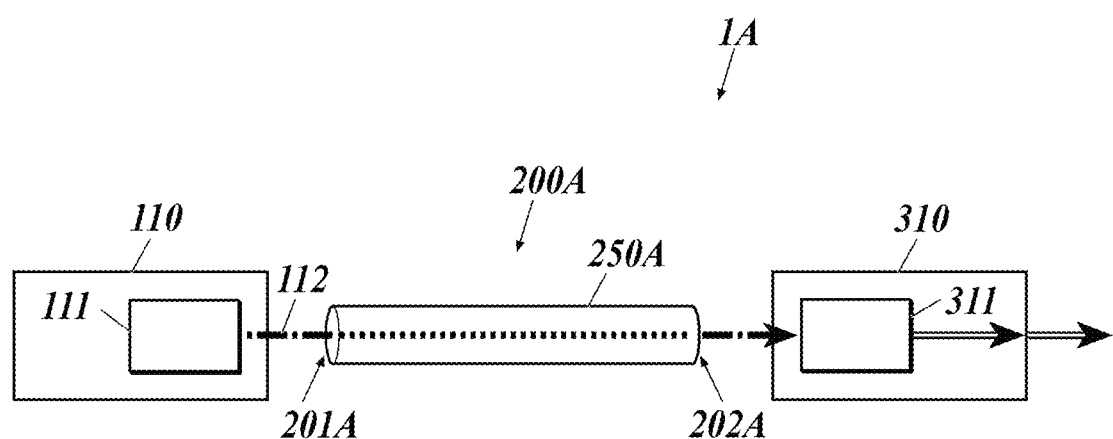
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light (laser beams) having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
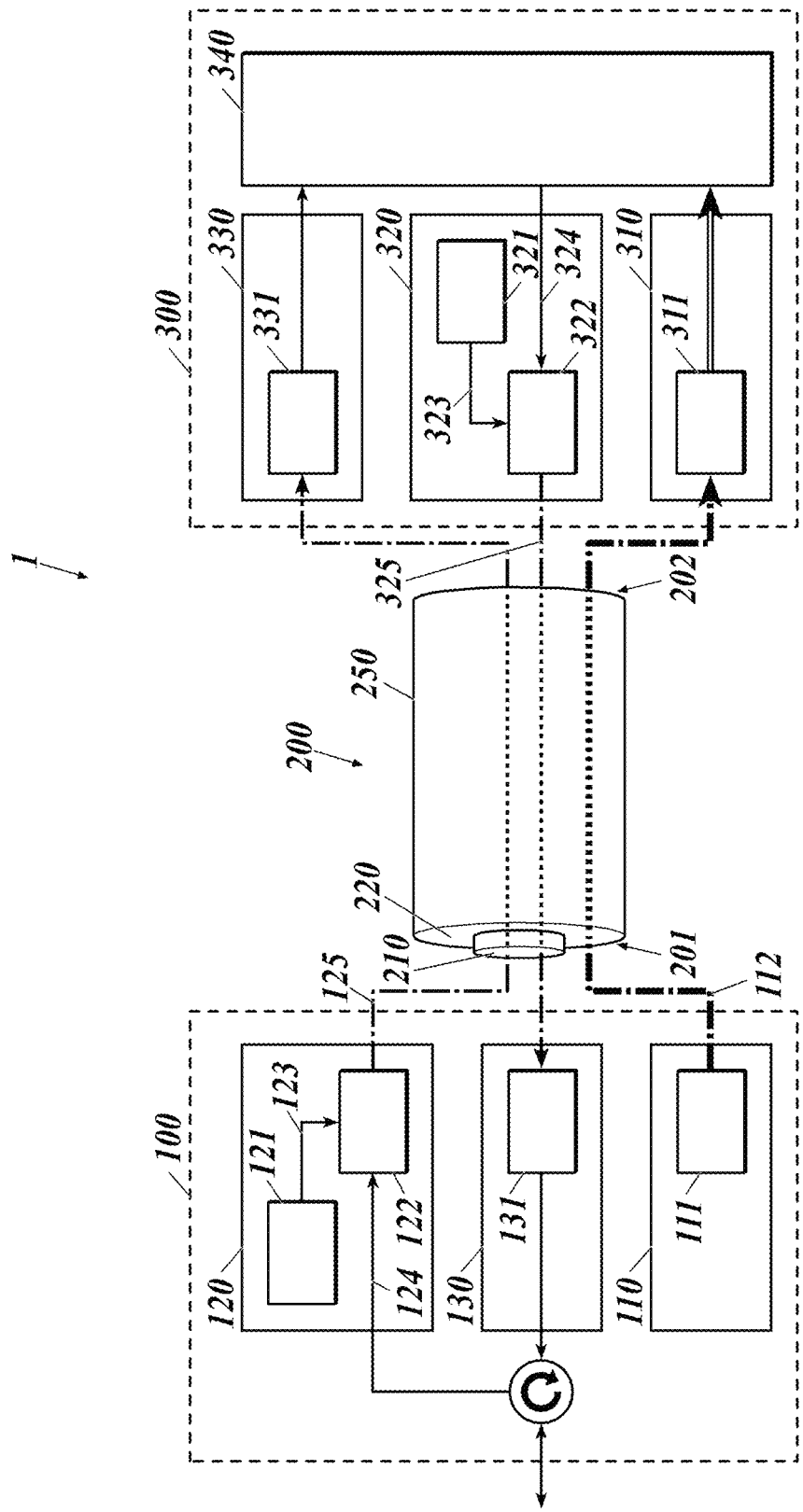
FIG. 2 is a block diagram of a power over fiber system according to a second embodiment of the present disclosure.

As shown in FIG. 2, a power over fiber (PoF) system 1 of this embodiment includes an optical power supply system through an optical fiber and an optical communication system therethrough, and includes: a first data communication device 100 including a power sourcing equipment (PSE) 110; an optical fiber cable 200; and a second data communication device 300 including a powered device (PD) 310.

In the following description, as a general rule, components donated by the same reference signs as those of already-described components are the same as the already-described components unless otherwise stated.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light (signal beams); and a cladding 220 that is arranged so as to surround the core 210 and forms a transmission path of feed light (feed beams).

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
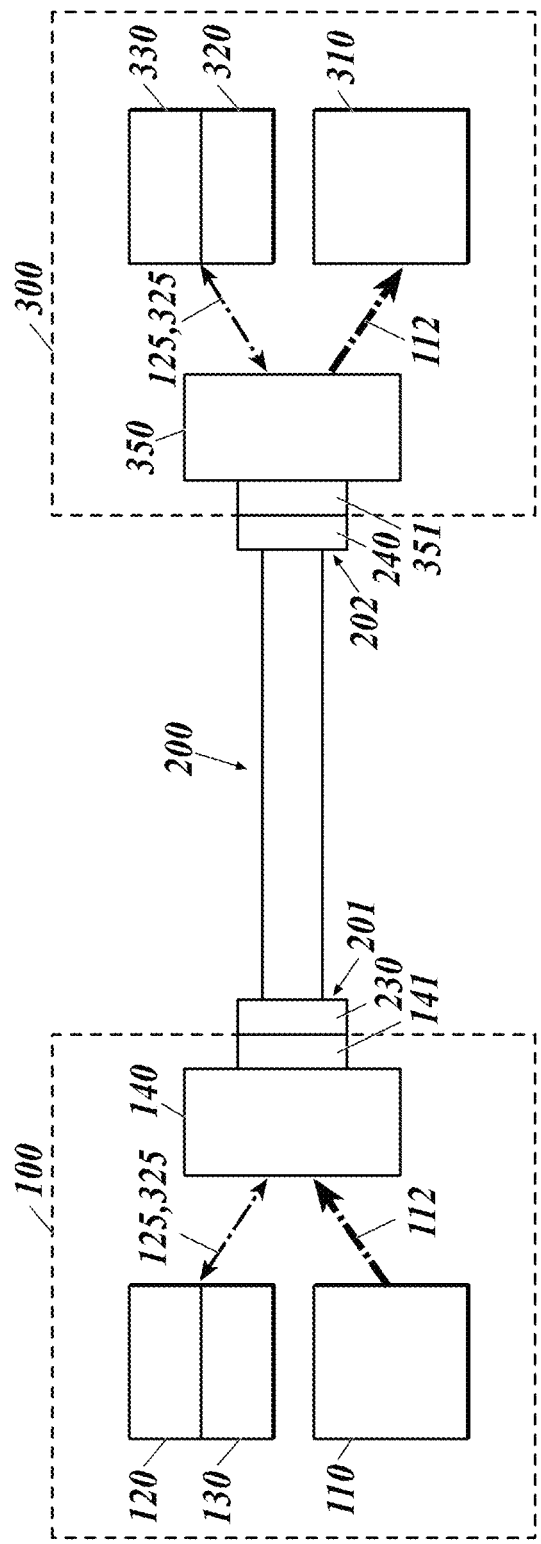
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125/325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
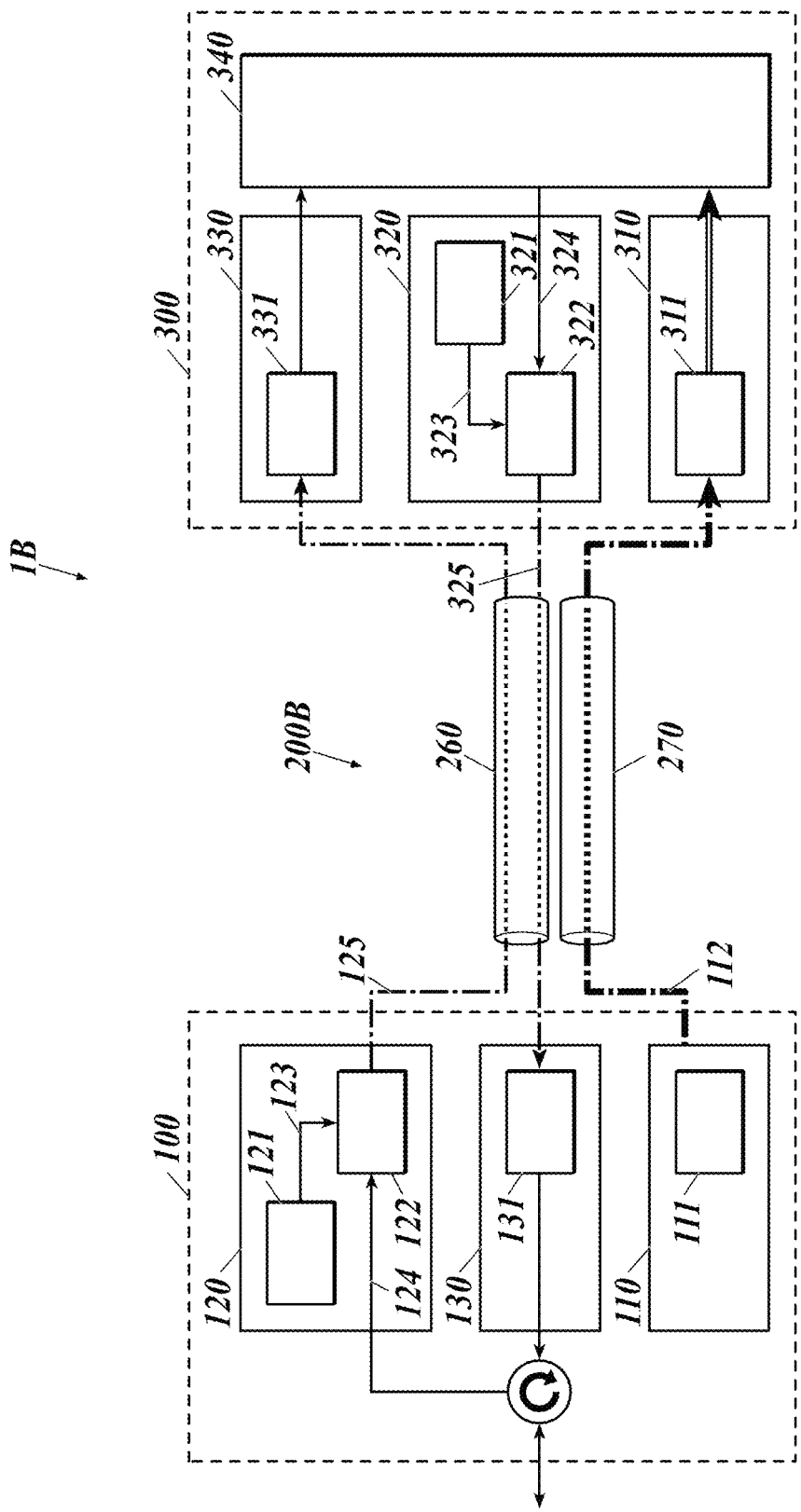
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Components that Perform Power Supply According to Transmission Length

[First Configuration Example to Perform Power Supply According to Transmission Length]

Next, a first configuration example to perform power supply according to the transmission length will be described with reference to the drawings.

Figure 5:
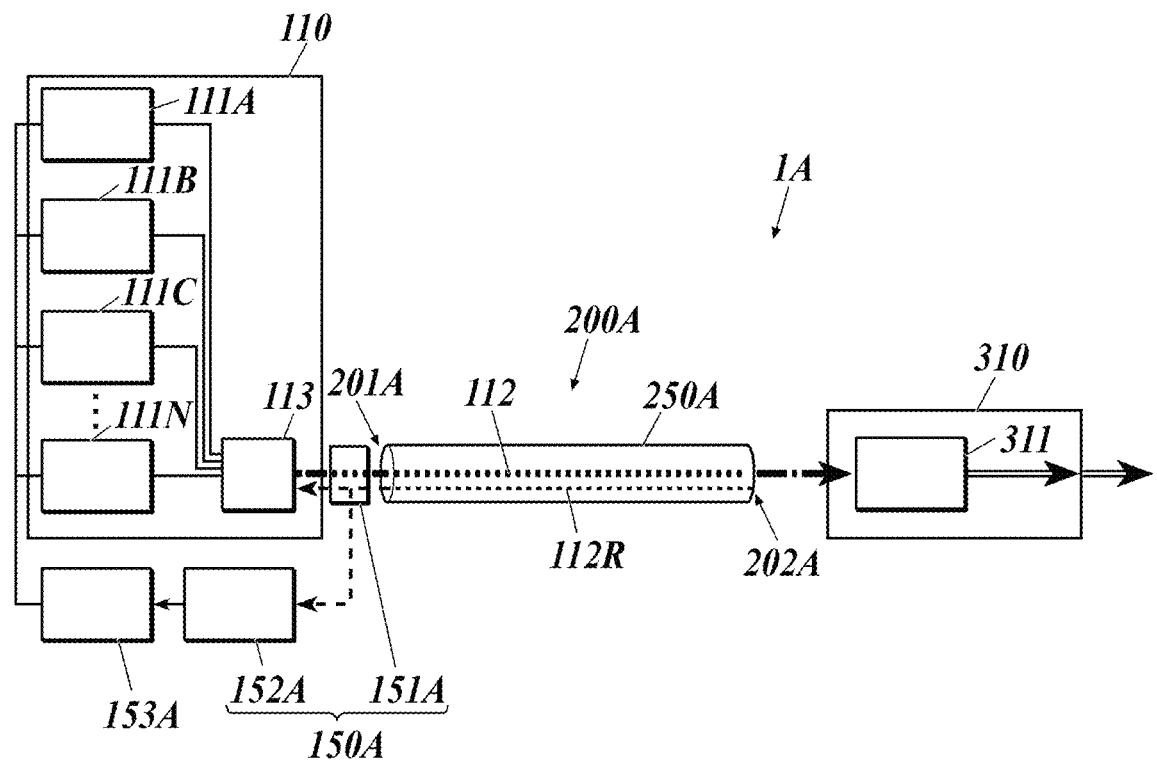
FIG. 5 is a block diagram of a first configuration example in which the power over fiber system according to the first embodiment of the present disclosure has components that perform power supply according to transmission length.
Figure 6:
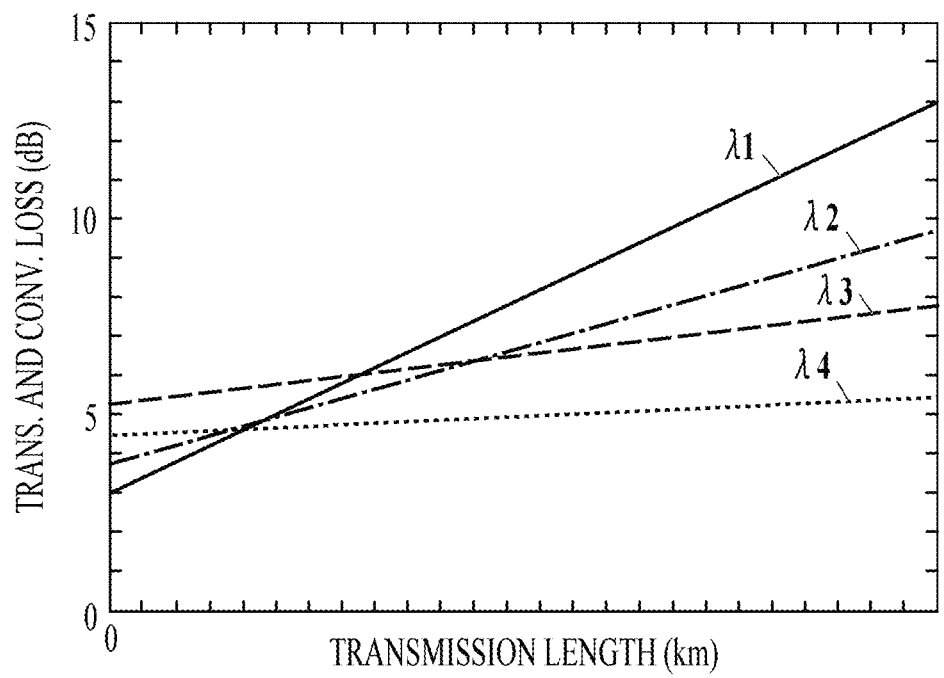
FIG. 6 is a line graph showing a relationship between loss at a transmission destination and the transmission length (loss-to-transmission-length characteristic) about laser wavelengths of feed light.

FIG. 5 shows the first configuration example in which the above-described power over fiber system 1A has components that perform power supply according to the transmission length. FIG. 6 is a line graph showing a relationship between loss at a transmission destination and the transmission length (loss-to-transmission-length characteristics) about laser wavelengths of feed light (feed beams).

In the following description, as a general rule, components donated by the same reference signs as those of already-described components are the same as the already-described components unless otherwise stated.

In FIG. 6, loss includes both transmission loss of an optical fiber cable and loss due to the photoelectric conversion efficiency. Reference signs $\lambda 1$ to $\lambda 4$ in FIG. 6 represent laser wavelengths, and the wavelength lengths satisfy "$\lambda 1 < \lambda 2 < \lambda 3 < \lambda 4$".

According to the feed beams having these different laser wavelengths, the increase rate of loss tends to be lower as the laser wavelength is longer, and the photoelectric conversion rate tends to be higher (the loss at a length of 0 tends to be smaller) as the laser wavelength is shorter.

The transmission efficiency of feed light is mainly determined from the transmission loss and the photoelectric conversion efficiency. Hence, the laser wavelength of feed light having a high transmission efficiency differs from transmission length to transmission length. In the light of this, the power over fiber system 1A of the first configuration example includes, as components that perform power supply according to the transmission length, the power sourcing equipment 110 capable of outputting the feed light 112 by changing the laser wavelength thereof, a measurer 150A that measures the distance from the power sourcing equipment 110 to the powered device 310, and a control device 153A that on the basis of the distance from the power sourcing equipment 110 to the powered device 310 measured by the measurer 150A, controls the power sourcing equipment 110 to output the feed light 112 with a proper laser wavelength.

The power sourcing equipment 110 includes a plurality of semiconductor lasers 111A to 111N having different laser wavelengths and an optical coupler 113 that guides the feed light 112 output from each of the semiconductor lasers 111A to 111N to the optical fiber cable 200A.

In FIG. 5, for convenience in drawing, transmission lengths from the respective semiconductor lasers 111A to 111N to the optical fiber cable 200A, or 200, are shown differently. However, in reality, the transmission lengths from the respective semiconductor lasers 111A to 111N to the optical fiber cable 200A, or 200, are adjusted to be equal (which applies to FIG. 7 to FIG. 9 described below).

In the first embodiment, the condition(s) for a preferred semiconductor material of the semiconductor laser 111 is described. At least one of the semiconductor lasers 111A to 111N satisfies the same condition as the semiconductor laser 111. All the semiconductor lasers 111A to 111N may satisfy the condition for a preferred semiconductor material.

The laser wavelengths of the semiconductor lasers 111A to 111N are all different from one another. Although it is preferable that many semiconductor lasers be provided, at least two types thereof are provided.

The power over fiber system 1A of the first configuration example includes a separator 151A that is provided between the optical fiber cable 200A and the power sourcing equipment 110 and takes out reflected light 112R of the feed light 112 reflected at/by the end (end face) of the optical fiber cable 200A close to the powered device 310, a photodiode 152A that receives the reflected light 112R taken out by the separator 151A, and a control device 153A that controls the power sourcing equipment 110 on the basis of detection by the photodiode 152A.

The separator 151A is configured by a beam splitter, an optical coupler or the like, and arranged between the optical coupler 113 and the optical fiber cable 200A.

The separator 151A lets the feed light 112 pass through, the feed light 112 travelling from the optical coupler 113 toward the optical fiber cable 200A, and also transmits, to the photodiode 152A, a portion of the reflected light 112R travelling from the optical fiber cable 200A toward the optical coupler 113.

The separator 151A may be provided in the middle of the optical fiber cable 200A, near the end thereof close to the power sourcing equipment 110.

The photodiode 152A is arranged so as to face a direction in which the separator 151A reflects the reflected light 112R, and detects the light intensity of the incident reflected light 112R. The detection signal of the photodiode 152A is input to the control device 153A.

When the distance from the power sourcing equipment 110 to the powered device 310 is measured, the control device 153A outputs single-pulse feed light 112 from one of the semiconductor lasers 111A to 111N, which are for power supply, and measures the time elapsed before the photodiode 152A detects the reflected light 112R. From the measured elapsed time, the control device 153A calculates the distance from the power sourcing equipment 110 to the powered device 310. The single-pulse feed light 112 may be output by any of the semiconductor lasers 111A to 111N, which is, for example, preset.

To be precise, the control device 153A having the function of calculating the above distance, the separator 151A and the photodiode 152A constitute a measurer 150A.

The control device 153A includes a memory that stores table data in which for each of groups into which transmission lengths are classified, a semiconductor laser having the highest transmission efficiency among the semiconductor lasers 111A to 111N is recorded. Referring to this table data, the control device 153A selects a semiconductor laser having the highest transmission efficiency from among the semiconductor lasers 111A to 111N on the basis of the group to which the measured distance from the power sourcing equipment 110 to the powered device 310 belongs.

The control device 153A makes a switch to the semiconductor laser selected from among the semiconductor lasers 111A to 111N to output the feed light 112 thereafter.

The control device 153A may be configured by a microcomputer or a sequencer using an analog circuit or a digital circuit.

The distance from the power sourcing equipment 110 to the powered device 310 is measured at the start of power supply (immediately before the start included) or at the startup of the power over fiber system 1A (immediately before the startup included).

As described above, in the power over fiber system 1A of the first configuration example, it is possible that the control device 153A controls the power sourcing equipment to output the feed light 112 by changing the laser wavelength thereof for the distance from the power sourcing equipment 110 to the powered device 310 measured by the measurer 150A. This enables power supply with a laser wavelength having a high transmission efficiency and can improve the feed light rate, as compared with the case where power supply is performed with a fixed laser wavelength.

The power sourcing equipment 110 has the semiconductor lasers 111A to 111N having different laser wavelengths, and the control device 153A controls the power sourcing equipment 110 to output the feed light 112 by selecting one of the semiconductor lasers 111A to 111N for the measured distance. This enables power supply with a wide variety of laser wavelengths without an optical element(s), such as a wavelength conversion element.

[Second Configuration Example to Perform Power Supply According to Transmission Length]

Figure 7:
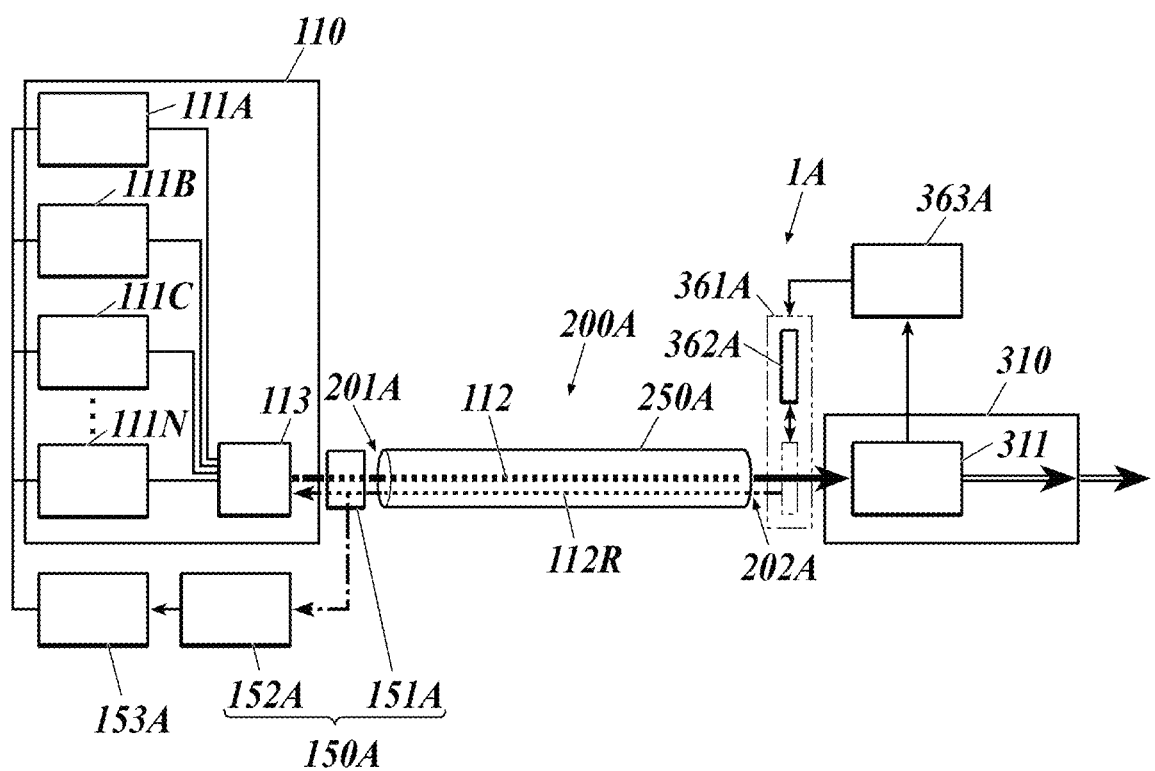
FIG. 7 is a block diagram of a second configuration example in which the power over fiber system according to the first embodiment of the present disclosure has components that perform power supply according to the transmission length.

Next, a second configuration example to perform power supply according to the transmission length will be described with reference to the drawings. FIG. 7 shows the second configuration example in which the above-described power over fiber system 1A has components that perform power supply according to the transmission length.

In the second configuration example, as shown in FIG. 7, to the power over fiber system 1A of the first configuration example, a reflecting device 361A and a control device 363A for the reflecting device 361A are added. The reflecting device 361A has a mirror 362A that reflects the feed light 112, and is arranged between the optical fiber cable 200A and the powered device 310.

The second configuration example is the same as the first configuration example except that the distance is measured on the basis of not the reflected light 112R of the feed light 112 reflected at the end face of the optical fiber cable 200A close to the powered device 310 but the reflected light 112R reflected by the mirror 362A.

The reflecting device 361A includes an actuator that switches the mirror 362A between a reflective position where the mirror 362A can reflect the feed light 112 and a standby position where the mirror 362A does not block the feed light 112 from entering the photoelectric conversion element 311, between the optical fiber cable 200A and the powered device 310.

The control device 363A is configured by a microcomputer, a sequencer using an analog circuit or a digital circuit, or the like, and controls the above position switching operation of the mirror 362A of the reflecting device 361A.

As the initial position, the reflecting device 361A holds the mirror 362A at the standby position. When the feed light 112 is input from the power sourcing equipment 110 to the photoelectric conversion element 311 at the start of power supply or at the startup of the system, a power source is supplied to the control device 363A.

When the power source is supplied, the control device 363A performs control to temporarily switch the positon of the mirror 362A of the reflecting device 361A to the reflective position and then return the mirror 362A to the standby position.

This allows the control device 153A to obtain the distance from the power sourcing equipment 110 to the powered device 310 by measuring the time elapsed since start of output of the feed light 112 to receipt of the reflected light 112R reflected by the mirror 362A. This elapsed time includes a delay time from when the photoelectric conversion element 311 receives the feed light 112 to when the control device 363A switches the position of the mirror from the standby position to the reflective position. This delay time is obtained in advance by measuring or the like, and stored in the control device 153A. The control device 153A calculates the distance after subtracting the delay time from the elapsed time.

The control device 153A selects a semiconductor laser having the highest transmission efficiency from among the semiconductor lasers 111A to 111N, and makes a switch to the selected semiconductor laser to output the feed light 112 thereafter.

With no control device 363A provided, the control device 153A may be connected to the reflecting device 361A by another system (e.g. a signal line, etc.) different from the feed light 112 so as to be able to control the reflecting device 361A.

The second configuration example can obtain the same effects as the first configuration example, and also, if the measurer 150A is configured to measure the distance from the power sourcing equipment 110 to the powered device 310 by making use of reflection of the feed light 112, which is laser light, with the mirror 362A, can use the reflected light 112R having a higher light intensity, and accordingly can measure the distance more stably with higher accuracy.

In the first and second configuration examples, the power over fiber system 1A is the base structure. However, the power over fiber system 1 can also be configured, like the first configuration example, to perform power supply with a proper laser wavelength by providing the measurer 150A and the control device 153A. The power over fiber system can also be configured, like the second configuration example, to reflect the feed light 112 with the mirror 362A by adding the reflecting device 361A and the control device 363A.

[Third Configuration Example to Perform Power Supply According to Transmission Length]

Next, a third configuration example to perform power supply according to the transmission length will be described with reference to the drawings.

Figure 8:
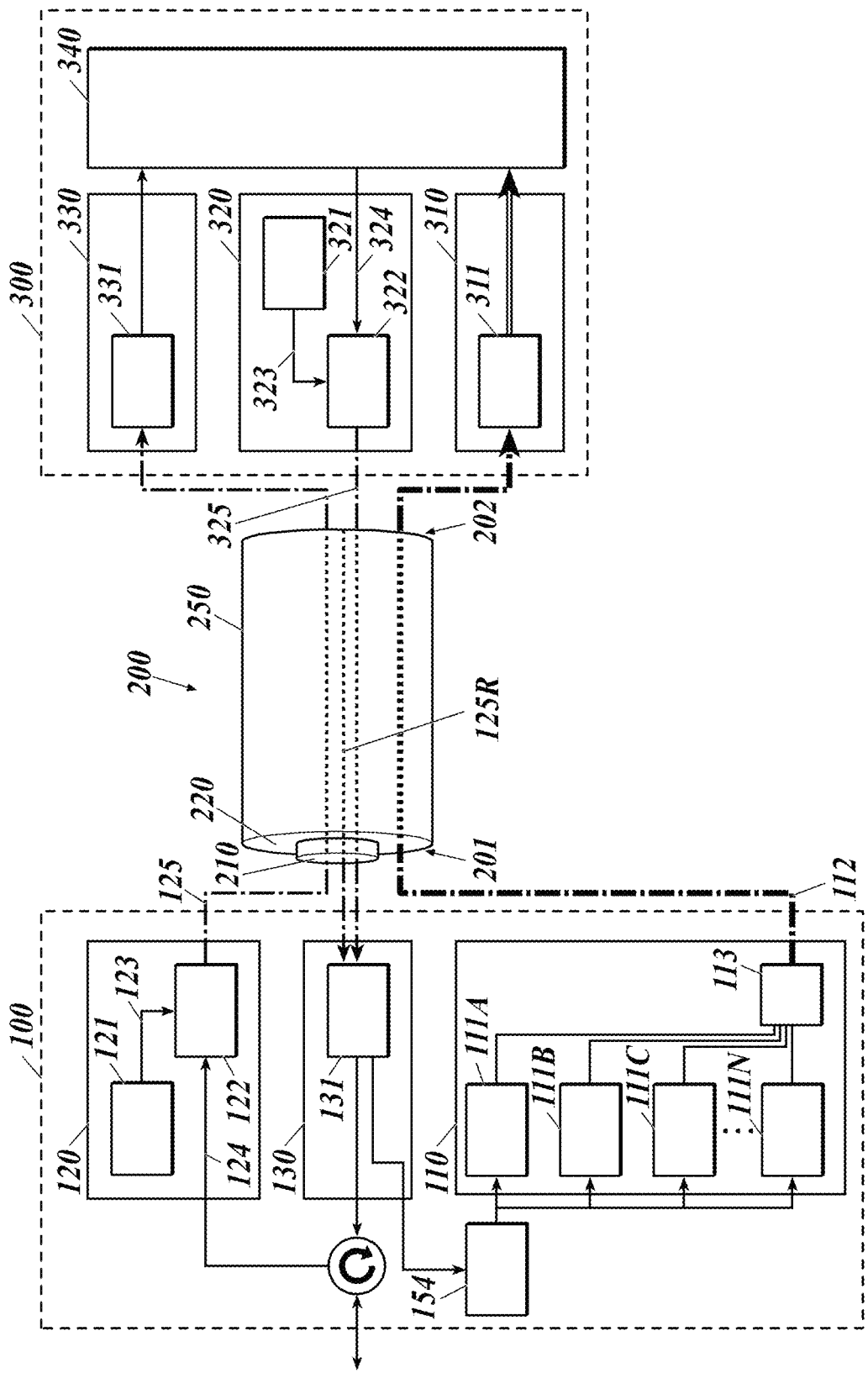
FIG. 8 is a block diagram of a third configuration example in which the power over fiber system according to the second embodiment of the present disclosure has components that perform power supply according to the transmission length.

FIG. 8 shows the third configuration example in which the above-described power over fiber system 1 has components that perform power supply according to the transmission length.

The power over fiber system 1 of the third configuration example uses, in order to perform power supply according to the transmission length, not the reflected light 112R of the feed light 112 but reflected light 125R of the signal light 125, which is laser light, reflected at the end face of the optical fiber cable 200 close to the second data communication device 300 (powered device 310).

In the power over fiber system 1, the first data communication device 100 having the power sourcing equipment 110 includes the photodiode 131 that receives the signal light 325 from the semiconductor laser 321, and, using this as a measurer, measures the distance by receiving the reflected light 125R of the signal light 125.

Further, to the power over fiber system 1, a control device 154 is added. The control device 154 controls the transmitter 120 and the power sourcing equipment 110.

When the distance from the first data communication device 100 (power sourcing equipment 110) to the second data communication device 300 (powered device 310) is measured, the control device 154 outputs single-pulse signal light 125 from the semiconductor laser 121 of the transmitter 120, and measures the time elapsed before the photodiode 131 detects the reflected light 125R. From the measured elapsed time, the control device 154 calculates the distance from the power sourcing equipment 110 to the powered device 310.

The control device 154 having the function of calculating the above distance, the semiconductor laser 121 and the photodiode 131 constitute a measurer.

The control device 154 too includes a memory that stores table data in which for each of groups into which transmission lengths are classified, a semiconductor laser having the highest transmission efficiency among the semiconductor lasers 111A to 111N is recorded. Referring to this table data, the control device 154 selects, from among the semiconductor lasers 111A to 111N, a semiconductor laser having the highest electric power transmission efficiency for the measured and obtained distance from the first data communication device 100 (power sourcing equipment 110) to the second data communication device 300 (powered device 310) to perform power supply therewith.

The control device 154 may also be configured by a microcomputer or a sequencer using an analog circuit or a digital circuit.

The distance is measured at the start of power supply (immediately before the start included) or at the startup of the power over fiber system 1 (immediately before the startup included).

The power over fiber system 1 of the third configuration example selects one of the semiconductor lasers 111A to 111N on the basis of the measured distance, and hence can perform power supply with a high electric power transmission efficiency.

Further, since the photodiode 131 that receives the reflected light 125R of the signal light 125 measures the distance, it is unnecessary to provide the separator 151A on the route of the feed light 112. This can keep the transmission efficiency of the feed light 112 high.

Further, since the photodiode 131, which is a fundamental component of the power over fiber system 1, is utilized, the number of components to be newly added can be reduced. This can reduce the number of components and reduce production costs accordingly.

[Fourth Configuration Example to Perform Power Supply According to Transmission Length]

Next, a fourth configuration example to perform power supply according to the transmission length will be described with reference to the drawings.

Figure 9:
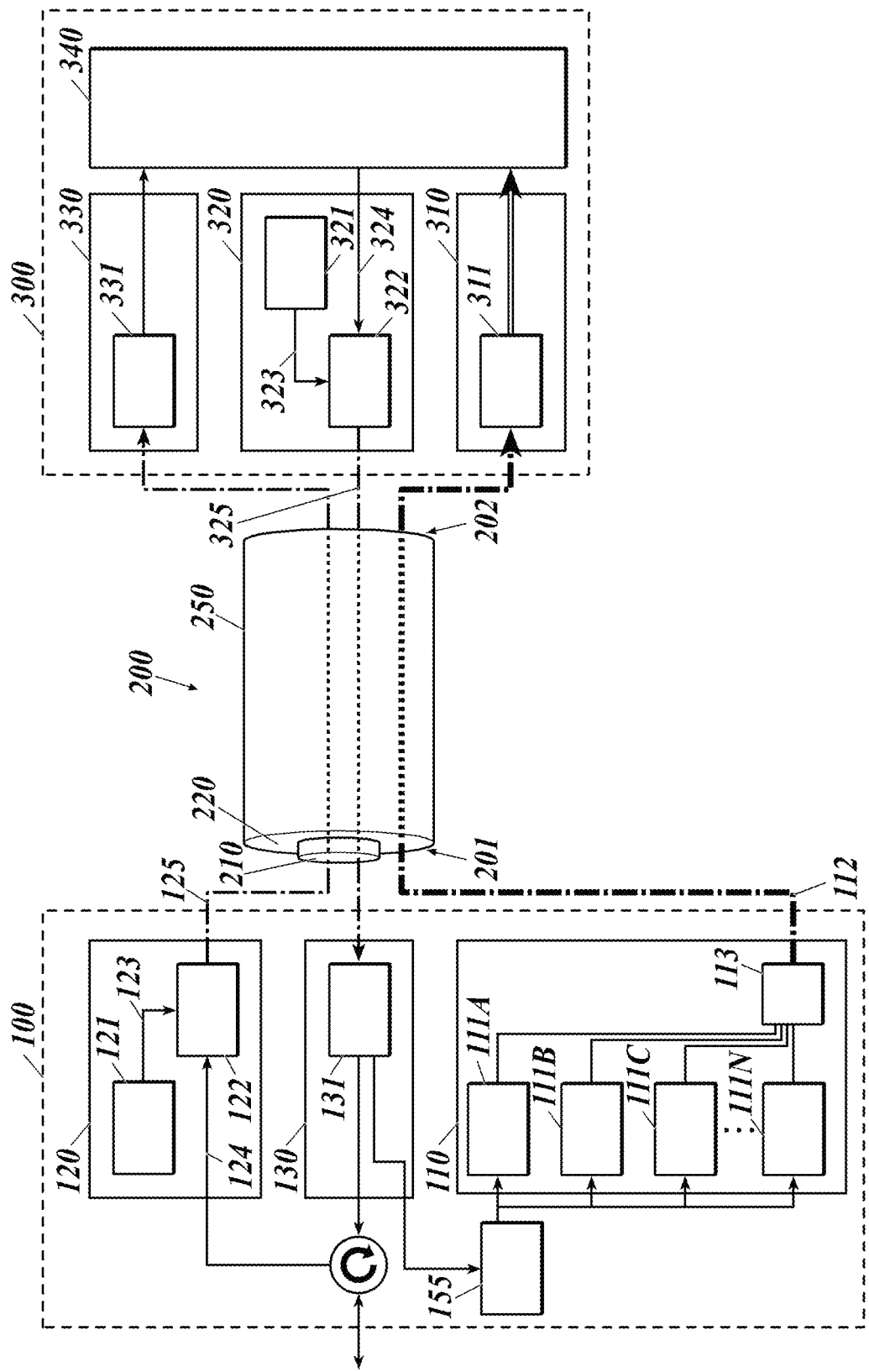
FIG. 9 is a block diagram of a fourth configuration example in which the power over fiber system according to the second embodiment of the present disclosure has components that perform power supply according to the transmission length.

FIG. 9 shows the fourth configuration example in which the above-described power over fiber system 1 has components that perform power supply according to the transmission length.

In the power over fiber system 1 of the fourth configuration example, a measurer measures the distance from the first data communication device 100 (power sourcing equipment 110) to the second data communication device 300 (powered device 310) on the basis of the signal light (laser light) 125 emitted from the semiconductor laser 121 provided as a laser light source in the first data communication device 100 (power sourcing equipment 110) and the signal light (laser light) 325 as a response from the semiconductor laser 321 provided as a laser light source in the second data communication device 300 (powered device 310).

Further, to the power over fiber system 1, a control device 155 is added. The control device 155 controls the transmitter 120 and the power sourcing equipment 110.

When the distance from the first data communication device 100 (power sourcing equipment 110) to the second data communication device 300 (powered device 310) is measured, the control device 155 controls the modulator 122 of the transmitter 120 to cause the semiconductor laser 121 to output the signal light 125 for distance measurement.

In the second data communication device 300, when the photodiode 331 receives the signal light 125 for distance measurement, the data processing unit 340 controls the modulator 322 to cause the semiconductor laser 321 to output the signal light 325 as a response.

In order that the signal light 125 from the semiconductor laser 121 can be identified as the signal light 125 for distance measurement, it is preferable that, in the first data communication device 100, the modulator 122 perform unique modulation.

Similarly, in order that the signal light 325 from the semiconductor laser 321 can be identified as the signal light 325 as a response, it is preferable that, in the second data communication device 300, the modulator 322 perform unique modulation.

The control device 155 measures the time elapsed before the photodiode 131 detects the signal light 325. From the measured elapsed time, the control device 155 calculates the distance from the power sourcing equipment 110 to the powered device 310. This elapsed time includes a delay time from when the second data communication device 300 receives the signal light 125 to when the second data communication device 300 outputs the signal light 325. This delay time is obtained in advance by measuring or the like, and stored in the control device 155.

This allows the control device 155 to calculate the distance from the first data communication device 100 (power sourcing equipment 110) to the second data communication device 300 (powered device 310) from the transmission speed of light after subtracting the delay time from the elapsed time.

The control device 155 having the function of calculating the above distance, the semiconductor laser 121, the modulator 122, the photodiode 131, the semiconductor laser 321, the modulator 322, the photodiode 331 and the data processing unit 340 constitute the measurer.

Like the control device 154 described above, the control device 155 too includes a memory that stores table data in which for each of groups into which transmission lengths are classified, a semiconductor laser having the highest transmission efficiency among the semiconductor lasers 111A to 111N is recorded. Referring to this table data, the control device 155 selects, from among the semiconductor lasers 111A to 111N, a semiconductor laser having the highest transmission efficiency for the measured and obtained distance from the first data communication device 100 (power sourcing equipment 110) to the second data communication device 300 (powered device 310) to perform power supply therewith.

The control device 155 may also be configured by a microcomputer or a sequencer using an analog circuit or a digital circuit.

The distance is measured at the start of power supply (immediately before the start included) or at the startup of the power over fiber system 1 (immediately before the startup included). It is preferable that the distance be measured at least in a state in which a power source for the second data communication device 300 is secured by the feed light 112.

The fourth configuration example can obtain the same effects as the third configuration example, and also, since the distance is measured on the basis of the signal light 125 emitted from the semiconductor laser 121 and the signal light 325 as a response from the semiconductor laser 321, can use the signal light 125, 325 having a higher light intensity, and accordingly can measure the distance more stably with higher accuracy.

[Another Example of Power Sourcing Equipment]

Figure 10:
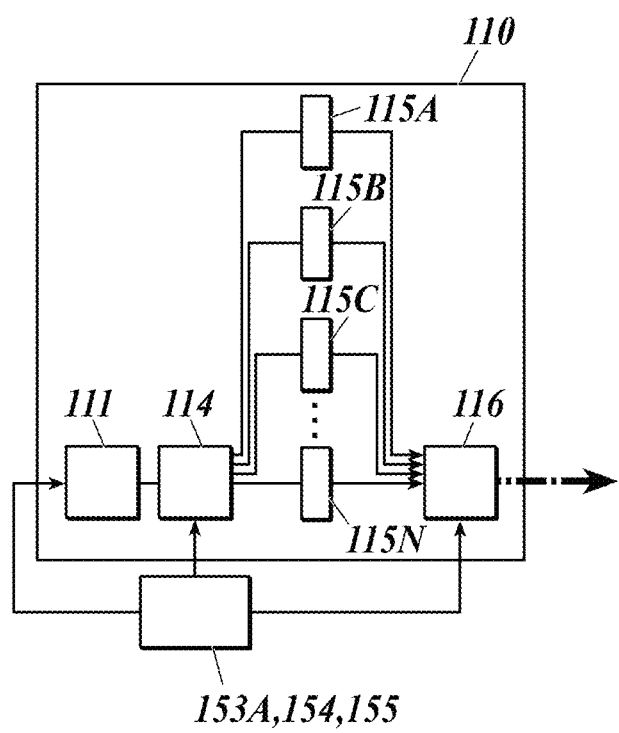
FIG. 10 is a block diagram showing another configuration example of a power sourcing equipment.

FIG. 10 is a block diagram showing another configuration example of the power sourcing equipment 110. The power sourcing equipment 110 of this another configuration example can be used in place of the power sourcing equipment 110 described in the first to fourth configuration examples.

Unlike the power sourcing equipment 110 having the semiconductor lasers 111A to 111N having different laser wavelengths shown in the first to fourth configuration examples, this power sourcing equipment 110 has one semiconductor laser 111. This semiconductor laser 111 satisfies the condition for a preferred semiconductor material described in the first embodiment.

Further, the power sourcing equipment 110 includes a plurality of optical elements 115A to 115N that change the laser wavelength of the feed light 112 output from the semiconductor laser 111 to wavelengths different from one another, an optical switch 114 that guides the feed light 112 from the semiconductor laser 111 to one of the optical elements 115A to 115N, and an optical coupler 116 that guides the feed light 112 having passed through any of the optical elements 115A to 115N to the optical fiber cable 200 or 200A.

The optical elements 115A to 115N, the optical switch 114 and the optical coupler 116 constitute a converter that converts the feed light 112 of the semiconductor laser 111 into laser wavelengths different from one another.

As each of the optical elements 115A to 115N, phosphor is used, for example. Phosphor has a physical property of absorbing light having a specific wavelength and emitting light having a wavelength different from that of the absorbed light. The phosphor may be either transmissive or reflective.

As each of the optical elements 115A to 115N, another component that performs wavelength conversion, such as an optical device capable of converting, by using a diffraction grating(s), the wavelength of laser light to be reflected, may be used.

Also, as each of the optical elements 115A to 115N, nonlinear crystal (BBO crystal, LBO crystal, BiBO crystal, etc.) may be used. Nonlinear crystal is capable of shortening the laser wavelength of the feed light 112.

At least two of the optical elements 115A to 115N are provided, but it is preferable that a larger number of optical elements be prepared to convert the laser wavelength of the feed light 112 into a wider variety of laser wavelengths.

In FIG. 10, for convenience in drawing, transmission lengths from the respective optical elements 115A to 115N to the optical fiber cable 200 or 200A are shown differently. However, in reality, the transmission lengths from the respective optical elements 115A to 115N to the optical fiber cable 200 or 200A are adjusted to be equal.

The power sourcing equipment 110 shown in FIG. 10 is provided with the control device 153A. The control device 153A controls the optical switch 114 to select one of the optical elements 115A to 115N for the laser wavelength selected by measuring the distance.

If the power sourcing equipment 110 shown in FIG. 10 is applied to the power over fiber system 1 of the third configuration example, the control device 154 performs the selection from the optical elements 115A to 115N, whereas if the power sourcing equipment 110 shown in FIG. 10 is applied to the power over fiber system 1 of the fourth configuration example, the control device 155 performs the selection from the optical elements 115A to 115N.

Thus, if the power sourcing equipment 110 is configured to output the feed light 112 with a laser wavelength having a high electric power transmission efficiency by using the converter, which converts the feed light 112 of the semiconductor laser 111 into laser wavelengths different from one another, a required number of semiconductor lasers for power supply can be reduced.

Further, if each of the optical elements 115A to 115N that convert the laser wavelength of the feed light 112 is an element that does not need to be controlled, such as phosphor, the number of components in the power sourcing equipment 110 to be controlled can be reduced, and the control system can be simplified accordingly.

[Others]

Although some embodiments of the present disclosure have been described above, these embodiments are made for purposes of illustration and example only. The present invention can be carried out in various other forms, and each component may be omitted, replaced or modified/changed within a range not departing from the scope of the present invention.

For example, FIG. 5 to FIG. 10 show examples in which the components that perform power supply according to the transmission length are applied to the power over fiber system 1 or 1A, but in the same manner, the components that perform power supply according to the transmission length are also applicable to the power over fiber system 1B.

INDUSTRIAL APPLICABILITY

A power over fiber system according to the present invention has industrial applicability to a power over fiber system that performs power supply by changing the laser wavelength.

The invention claimed is:

1. A power sourcing equipment for supplying power to a powered device, the power sourcing equipment comprising:
   a first semiconductor laser;
   a second semiconductor laser; and
   at least one controller configured to
      estimate a distance from the power sourcing equipment to the powered device based on at least one process,
      select one of the first semiconductor laser and the second semiconductor laser based on the distance, and
      cause the selected one of the first semiconductor laser and the second semiconductor laser to output a feed light to the powered device.

2. The power sourcing equipment according to claim 1,
   wherein the first semiconductor laser is configured to output the feed light having a first laser wavelength, and
   wherein the second semiconductor laser is configured to output the feed light having a second laser wavelength that is different from the first laser wavelength.

3. The power sourcing equipment according to claim 2, wherein the first laser wavelength is 500 nm or less.

4. The power sourcing equipment according to claim 2, wherein the first laser wavelength is in a range of 200-500 nm.

5. A power sourcing equipment for supplying power to a powered device, the power sourcing equipment comprising:
   a semiconductor laser configured to output a feed light to the powered device;
   a first laser wavelength converter configured to change a laser wavelength of the feed light to a first laser wavelength;
   a second laser wavelength converter configured to change the laser wavelength of the feed light to a second laser wavelength different from the first laser wavelength; and
   at least one controller configured to
      estimate a distance from the power sourcing equipment to the powered device based on at least one process,
      select one of the first laser wavelength converter and the second laser wavelength converter based on the distance, and
      cause the selected one of the first laser wavelength converter and the second laser wavelength converter to change the laser wavelength of the feed light.

* * * * *